(12) United States Patent
Hsu et al.

(10) Patent No.: US 8,252,654 B2
(45) Date of Patent: Aug. 28, 2012

(54) METHOD FOR MANUFACTURING MEMORY CELL

(75) Inventors: Tzu-Hsuan Hsu, Hsinchu (TW); Hang-Ting Lue, Hsinchu (TW)

(73) Assignee: MACRONIX International Co., Ltd., Hsinchu (TW)

(\*) Notice: Subject to any disclaimer, the term of this patent is extended or adjusted under 35 U.S.C. 154(b) by 0 days.

(21) Appl. No.: 12/942,312

(22) Filed: Nov. 9, 2010

(65) Prior Publication Data

US 2011/0053328 A1    Mar. 3, 2011

Related U.S. Application Data

(60) Division of application No. 11/958,134, filed on Dec. 17, 2007, now Pat. No. 7,855,411, which is a continuation-in-part of application No. 11/753,850, filed on May 25, 2007, now Pat. No. 7,795,088.

(60) Provisional application No. 60/980,792, filed on Oct. 18, 2007.

(51) Int. Cl.
*H01L 21/336* (2006.01)

(52) U.S. Cl. ........ 438/287; 438/216; 438/261; 438/591; 438/593; 257/324; 257/329; 257/E21.621; 257/E21.679

(58) Field of Classification Search .................. 438/216, 438/261, 287, 591, 593; 257/324, 329, E21.621, 257/E21.679
See application file for complete search history.

(56) References Cited

U.S. PATENT DOCUMENTS

| 2004/0256683 A1* | 12/2004 | Lee et al. ...................... 257/412 |
| 2005/0227435 A1* | 10/2005 | Oh et al. ...................... 438/257 |
| 2007/0007574 A1* | 1/2007 | Ohsawa ...................... 257/314 |
| 2007/0052010 A1 | 3/2007 | Hsu et al. ...................... 257/324 |

OTHER PUBLICATIONS

Chinese Examination Report of Taiwan Application No. 097119164, dated Dec. 7, 2011.

\* cited by examiner

*Primary Examiner* — Andy Huynh
(74) *Attorney, Agent, or Firm* — J.C. Patents (57) ABSTRACT

In a method for manufacturing a memory cell, a substrate is provided. A doped region with a first conductive type is formed in the substrate near a surface of the substrate. A portion of the substrate is removed to define a plurality of fin structures in the substrate. A plurality of isolation structures is formed among the fin structures. A surface of the isolation structures is lower than a surface of the fin structures. A gate structure is formed over the substrate and straddles the fin structure. The gate structure includes a gate straddling the fin structure and a charge storage structure located between the fin structure and the gate. A source/drain region is formed with a second conductive type in the fin structure exposed by the gate structure, and the first conductive type is different from the second conductive type.

10 Claims, 6 Drawing Sheets

METHOD FOR MANUFACTURING MEMORY CELL

CROSS-REFERENCE TO RELATED APPLICATION

This application is a divisional application of and claims the priority benefit of U.S. application Ser. No. 11/958,134, filed on Dec. 17, 2007, now allowed, which claims the priority benefit of U.S. provisional application Ser. No. 60/980,792, filed on Oct. 18, 2007, and is a continuation-in-part of U.S. application Ser. No. 11/753,850, filed on May 25, 2007. The entirety of each of the above-mentioned patent applications is incorporated herein by reference and made a part of this specification.

BACKGROUND OF THE INVENTION

1. Field of the Invention

The present invention relates to a manufacturing method of a semiconductor device. More particularly, the present invention relates to a manufacturing method of a memory cell.

2. Description of Related Art

Along with the development of integrated circuits technology, the level of integration has to increase continuously in order to improve the device speed and functions. Take memory structure for example. When information electronic products (such as computers, mobile phones, digital cameras or personal digital assistants) are needed to process and store more and more data day by day, the storage capacities of the memory structures required by these information electronic products have to increase as well. With such conflicting demand for a larger storage capacity but a shrinking size of the memory structure, developing methods that are capable of producing a smaller memory device with a higher integration level of the device while maintaining a desirable quality of performance has been a major target for the industry.

A typical electronically erasable programmable read-only memory (EEPROM) employs a floating gate and a control gate made of doped polysilicon. When programming a memory structure, the electrons injected into the floating gate are uniformly distributed in the entire polysilicon floating gate layer. Nevertheless, as memory cells shrink, the capacitance area between the floating gate and the control gate has to shrink as well. As a result, the size of the drive current is usually insufficient to perform operations such as programming, erasing and reading.

Although the industry has developed double gate memory cells and tri-gate memory cells to overcome the above-mentioned issues and improve the electrical performance of the device. However, these types of memory cells are expensive to manufacture and the fabrication process are complex. Further, the throughput of such memory cells is low. Moreover, in tri-gate memory cells, current leakage occurs at the corners of such device, and current leakage is worsened when the device is operated under high electric field. As a result, the reliability and stability of the memory device lowers and decreasing the production yield.

SUMMARY OF THE INVENTION

The present invention provides a memory cell possessing a doped region/doped cap layer disposed on the fin structure which overcomes the current leakage problem during the operations of the memory cell.

The present invention provides a method for manufacturing memory cells capable of decreasing the step height of each memory cell having fin structure and increasing the integration of the memory cells.

The present invention provides a memory cell disposed on a substrate and the substrate comprises a plurality of isolation structures that defines at least a fin structure in the substrate. Further, the surface of the fin structure is higher than the surface of the isolation structure. The memory cell comprises a doped region, a gate, a charge trapping structure and a source/drain region. The doped region is located in a top of the fin structure and near a surface of the top of the fin structure and the doped region has a first conductive type. The gate is disposed on the substrate and straddled the fin structure. The charge trapping structure is disposed between the gate and the fin structure. The source/drain region with a second conductive type is disposed in the fin structures exposed by the gate and the first conductive type is different from the second conductive type.

According to one embodiment of the invention, the thickness of the doped region is up to about 100 Å.

According to one embodiment of the invention, a doping concentration of the doped region is at least about $5 \times 10^{18}/cm^3$.

According to one embodiment of the invention, the memory cell further comprises a doped cap layer disposed between the charge trapping structure and the fin structure, wherein the doped cap layer has the first conductive type.

According to one embodiment of the invention, the thickness of the doped cap layer is up to about 200 Å.

According to one embodiment of the invention, a doping concentration of the doped cap layer is at least about $5 \times 10^{18}/cm^3$.

The invention provides a method for manufacturing a memory cell comprising the steps of providing a substrate and forming a doped region with a first conductive type in the substrate near a surface of the substrate. Then, a portion of the substrate is removed to define a plurality of fin structures in the substrate. A plurality of isolation structures are formed among the fin structures and the surface of the isolation structures is lower than the surface of the fin structures. A gate structure is formed over the substrate and straddling the fin structure and the gate structure comprises a gate straddling the fin structure and a charge trapping structure located between the fin structure and the gate. A source/drain region with a second conductive type is formed in the fin structure exposed by the gate structure and the first conductive type is different from the second conductive type.

According to one embodiment of the invention, the charge trapping structure is directly in contact with the fin structure.

According to one embodiment of the invention, the thickness of the doped region is up to about 100 Å.

According to one embodiment of the invention, a doping concentration of the doped region is at least about $5 \times 10^{18}/cm^3$. According to one embodiment of the invention, the method for forming the doped region comprises steps of forming a doped polysilicon layer having a plurality of dopants with the first conductive type therein and performing a thermal process to drive the dopants towards an interface between the substrate and the doped polysilicon layer so as to foam the doped region in the substrate.

According to one embodiment of the invention, the thickness of the doped polysilicon layer is up to about 200 Å.

According to one embodiment of the invention, a doping concentration of the doped polysilicon layer is at least about $5 \times 10^{18}/cm^3$.

The invention provides a method for operating a memory cell that is disposed on a substrate. The substrate has a plurality of isolation structures that define at least one fin structure and the memory cell comprises a doped region located in a top of the fin structure and near a surface of the top of the fin structure and having a first conductive type. The memory cell also comprises a gate disposed on the substrate and straddled the fin structure and a charge trapping structures disposed between the gate and the fin structure. The memory cell further comprises a first source/drain region and a second source/drain region respectively disposed in the fin structure at both sides of the gate. The first source/drain region and the second source/drain region have a second conductive type different from the first conductive type. The method comprising step of performing a programming operation by applying a first voltage to the gate, setting the first source/drain region and the second source/drain region to a floating or ground state in order to generate sufficient voltage difference between the gate and the substrate for making the charges store in the charge trapping structures to program the memory cell.

According to one embodiment of the invention, the first voltage is approximately 16V.

According to one embodiment of the invention, the method further comprises step of performing an erasing operation by applying a second voltage to the gate, setting the first source/drain region and the second source/drain region to a floating or ground state in order to generate sufficient voltage difference between the gate and the substrate for erasing the charges stored in the charge trapping structures to erase the memory cell.

According to one embodiment of the invention, the second voltage is approximately −16V.

According to one embodiment of the invention, the method further comprises step of performing the reading operation by applying a third voltage to the gate, a fourth voltage to the first source/drain region, and a fifth voltage to the second source/ drain region, wherein the third voltage is greater than the fifth voltage and the fifth voltage is greater than the forth voltage, to read the memory.

According to one embodiment of the invention, the third voltage is approximately 5 V, the forth voltage is approximately 0 V, and the fifth voltage is approximately 1 V.

The invention also provides a method for operating a memory cell that is disposed on a substrate. The substrate has a plurality of isolation structures that define at least one fin structure and the memory cell comprises a doped region located in a top of the fin structure and near a surface of the top of the fin structure and having a first conductive type. The memory cell also comprises a gate disposed on the substrate and straddled the fin structure and a first source/drain region and a second source/drain region that are respectively disposed in the fin structure formed on the two sides of the gate. The memory cell further comprises a charge trapping structure disposed between the gate and the fin structure. Also, the charge trapping structure comprises a first storage region and a second storage region adjacent to the first source/drain region and the second source/drain region respectively and a third storage region and a fourth storage region adjacent to the first source/drain region and the second source/drain region respectively. The method comprises step of performing a programming operation by applying a first voltage to the gate, a second voltage to the first source/drain region, and a third voltage to the second source/drain region. Thus, the first voltage is greater than the third voltage and the third voltage is greater than the second voltage to inject charges to the second storage region and the fourth storage region that are adjacent to the second doped region.

According to one embodiment of the invention, the first voltage is approximately 10 V, the second voltage is approximately 0 V and the third voltage is approximately 5 V.

According to one embodiment of the invention, the method further comprises step of performing an erasing operation by applying a fourth voltage to the gate, a fifth voltage to the first source/drain region, and a sixth voltage to the second source/ drain region, wherein the sixth voltage is greater than the fifth voltage and the fifth voltage is greater than the fourth voltage, to erase the charges in the second storage region and the fourth storage region.

According to one embodiment of the invention, the fourth voltage is approximately −5 V, the fifth voltage is approximately 0 V and the sixth voltage is approximately 5 V.

According to one embodiment of the invention, the method further comprises step of performing the reading operation by applying a seventh voltage to the gate, a eighth voltage to the first source/drain region, and a ninth voltage to the second source/drain region, wherein the seventh voltage is greater than the eighth voltage and the eighth voltage is greater than the ninth voltage, to read the memory.

According to one embodiment of the invention, the seventh voltage is approximately 5 V, the eighth voltage is approximately 1.6 V, and the ninth voltage is approximately 0 V.

In the present invention, by performing a surface treatment to form either a doped region in the fin structure or a doped polysilicon cap layer on the fin structure with the conductive type complementary to that of the channel between the source/drain regions, the current leakage at the top corners of the fin structure can be suppressed and the electrical performance of the memory cell during operation is improved. The present invention also makes use of trimming process to miniaturize the patterned mask layer and to form memory cells having fin-structures in the substrate. The present invention increases the level of integration using simple and inexpensive methods.

In order to make the aforementioned and other features and advantages of the present invention more comprehensible, embodiments accompanied with figures are described in detail below.

BRIEF DESCRIPTION OF THE DRAWINGS

FIG. 1G-1 is a schematic 3-D view of FIG. 1G illustrating a memory cell according to one embodiment of the present invention.

DESCRIPTION OF EMBODIMENTS

FIGS. 1A through 1G are schematic cross-sectional views illustrating the steps for manufacturing a memory cell according to one embodiment of the present invention.

Figure 1A:
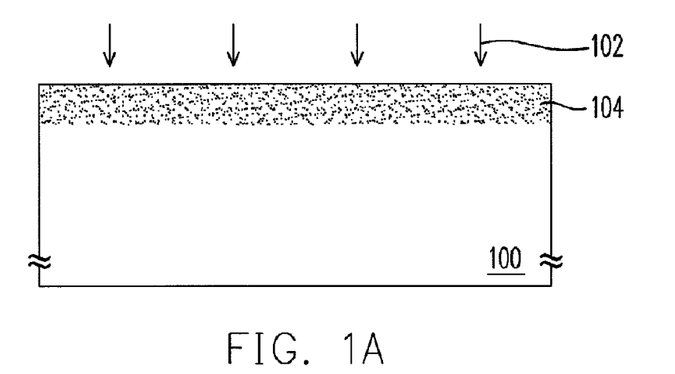
FIGS. 1A through 1G are schematic cross-sectional views illustrating the steps for manufacturing a memory cell according to one embodiment of the present invention.

As shown in FIG. 1A, the present invention provides a method for manufacturing memory cells. First, a substrate 100 is provided. The substrate can be a bulk-Si substrate or a silicon-on-insulator (SOI) substrate. A surface treatment 102 is performed on the substrate 100 so as to Ruin a doped region 104 in the substrate 100 and near the surface of the substrate 100. It should be noticed that the conductive type of the doped region 104 is complementary to the conductive type of the later formed channel region of the memory cell in order to suppress the current leakage due to the corner edge effect during the operation of memory cells. That is, when the memory cell has an n-type channel region, the doped region 104 is a p-type doped region, and vice versa. The thickness of the doped region 104 in the substrate 100 is up to about 100 angstrom. Also, the doping concentration of doped region 104 is at least about $5 \times 10^{18}/cm^3$. Furthermore, the surface treatment 102 includes an ion implantation process.

Figure 1B:
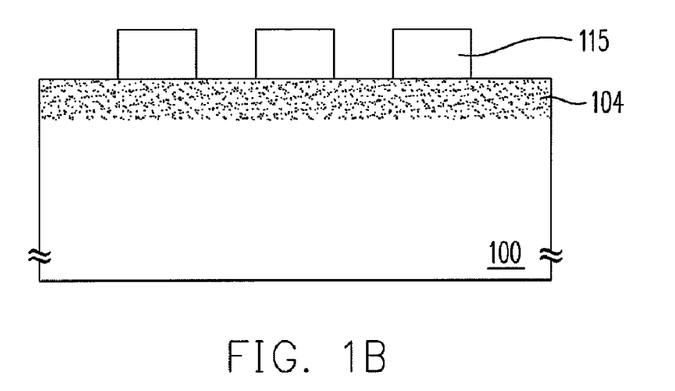

As shown in FIG. 1B, a patterned mask layer 115 is formed on the substrate 100. The material used for fabricating the patterned mask layer 115 is, for example, silicon nitride, and the method for fabricating the same includes, for example, first forming a mask material layer (not shown) on the substrate 100 using a chemical vapor deposition process and then performing a photolithography process.

Figure 1C:
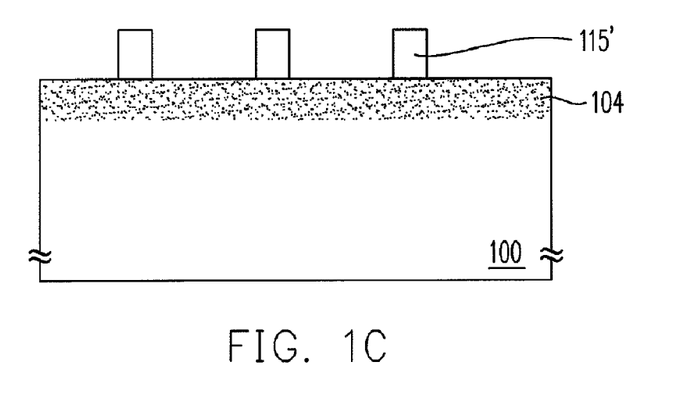

As shown in FIG. 1C, the patterned mask layer 115 is trimmed to miniaturize its size. The method for trimming the patterned mask layer 115 is, for example, a wet etching process. Specifically, the trimming process is to immerse the substrate 100 in hot phosphoric acid for a period of time to miniaturize the patterned mask layer 115 to a predetermined size. In one embodiment, the dimension of the patterned mask layer 115 after its formation by a photolithography process is, for example, 0.18 μm, and the dimension of the patterned mask layer 115' after trimming is miniaturized to 0.05 μm.

Figure 1D:
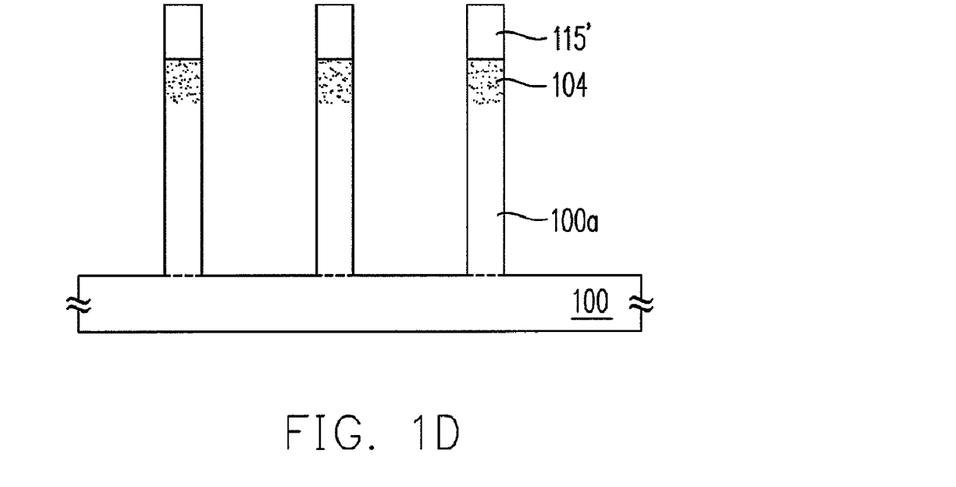

As shown in FIG. 1D, a portion of the substrate 100 is removed using the patterned mask layer 115' as a mask and a plurality of fin structures 100a are defined in the substrate 100. The method for removing the portion of the substrate 100 is, for example, a dry etching process such as a reactive ion etching process.

Figure 1E:
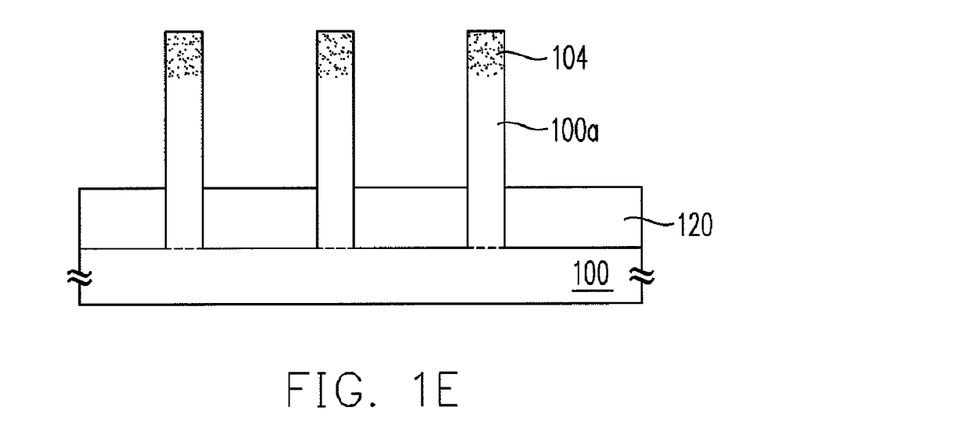

As shown in FIG. 1E, the patterned mask layer 115' is removed and a plurality of isolation structures 120 are framed among the fin structures 100a. Prior to removing the patterned mask layer 115', an isolation material layer (not shown) is formed on the substrate to fill the gaps between the fin structures 100a using a method such as a high density plasma chemical vapor deposition (HDP-CVD) process and the material of the isolation material layer is silicon oxide, for example, or other dielectric materials. Then, a portion of the isolation material layer is removed to expose the patterned mask layer 115'. Afterward, the patterned mask layer 115' is removed using a wet etching process or a dry etching process. Next, a portion of the isolation material layer is removed to form isolation structures 120 with a surface that is lower than that of the fin structure 100a.

Figure 1F:
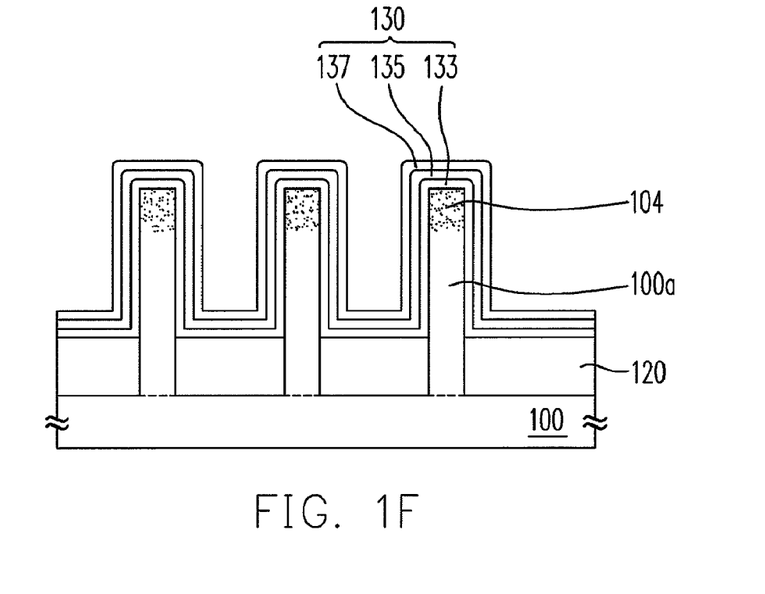
Figure 1F:
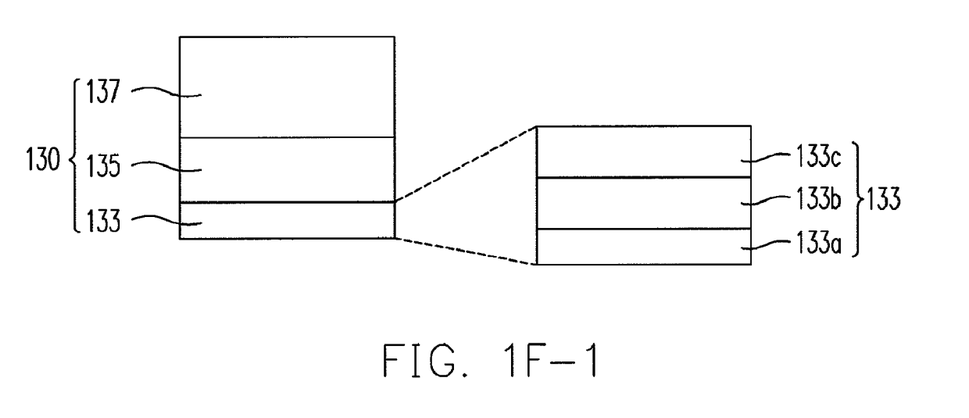

In FIG. 1F, the charge trapping structure 130 is formed over the substrate 100. The charge trapping structure 130 includes a tunneling dielectric layer 133, a charge trapping layer 135 and a blocking dielectric layer 137 from the bottom to the top. Herein, the material used for fabricating the tunneling dielectric layer 133 includes dielectric material like silicon oxide, and the method for fabricating the same is, for example, a chemical vapor deposition process. Referring to FIG. 1F-1, the tunneling dielectric layer 133 also may be a bandgap engineered tunneling structure, for example, a structure stacked by a bottom silicon oxide layer 133a in the bottom/a silicon nitride layer 133b in the middle/a top silicon oxide layer 133c at the top from bottom to top, wherein the formation method of each layer may be a chemical vapor deposition process. The material used for fabricating the charge trapping layer 135 is, for example, silicon nitride, and the method for fabricating the same is, for example, a chemical vapor deposition process. The charge trapping layer could be call the charge storage layer when the used material is conductive, for example, polysilicon. The material used for fabricating the blocking dielectric layer 137 is, for example, silicon oxide, and the method for fabricating the same is, for example, a chemical vapor deposition process. Certainly, the materials used for fabricating the tunneling dielectric layer 133 and the blocking dielectric layer 137 can be other materials similar to the aforementioned. The material used for fabricating the charge trapping layer 135 is not limited to silicon nitride. Specifically, it can be other material having a high dielectric constant that is capable of trapping charges such as aluminum oxide, tantalum oxide, strontium titanate or hafnium oxide.

Figure 1G:
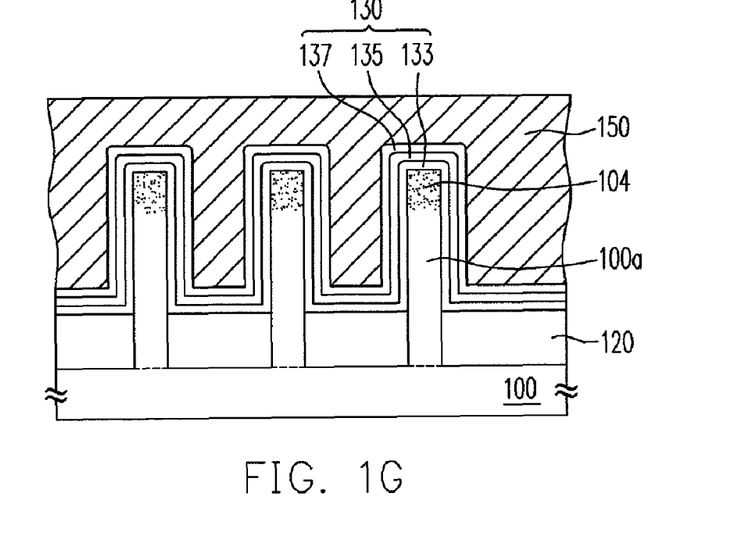
Figure 1G:
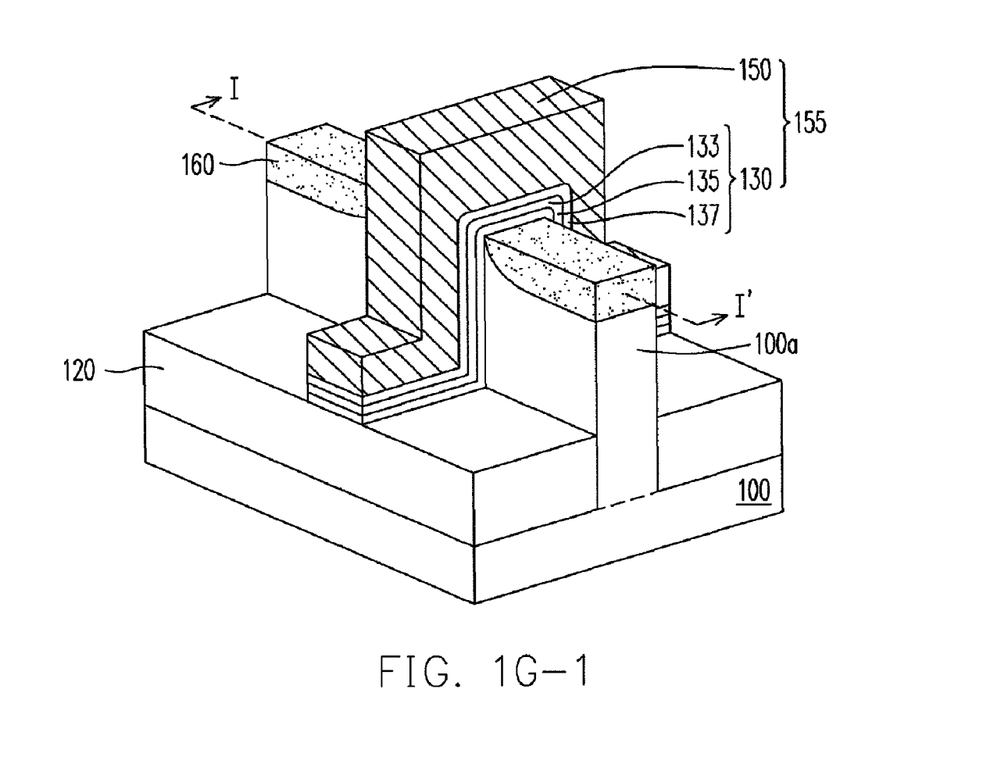

As shown in FIG. 1G, a conductive layer 150 is formed over the substrate 100. Then, the conductive layer 150 and the charge trapping structure 130 are patterned to form a gate structure 155 (shown in FIG. 1G-1), straddling the fin structure 100a. The material used for fabricating the conductive layer 150 is, for example, doped polysilicon. Next, source/drain regions are formed in the fin structures 100a exposed by the gate structure 155 (As shown in FIG. 1G-1). The source/drain regions can be heavily N-doped regions or P-doped regions and the method for fabricating the same is, for example, an ion implantation process.

In the above-mentioned embodiment, a wet etching process can be used to trim the patterned mask layer 115 to overcome the limitations of photolithography so that the size of each fin structure is smaller than the resolution of the optical tool used in the photolithography, and a simple and inexpensive method is achieved to form memory cells with fin-structures to improve the integration level of devices.

Further, the method for forming fin structure with relatively small size can be also applied to the process for patterning the layer of the doped polysilicon to be the gate with size smaller than the limitation of photolithography. Thus, during the photolithography for forming the gate structure 155, a patterned mask layer (not shown) similar to the patterned mask layer 115 shown in FIG. 1B is formed on the layer of doped polysilicon and the patterned mask layer on the layer of doped polysilicon is trimmed as the patterned mask layer 115 trimmed to be the patterned mask layer 115' shown in FIG. 1C. Thereafter, the layer of doped polysilicon is patterned to be the gate structure 155 by using the trimmed patterned mask layer. Hence, the size of the gate structure 155 is smaller than the resolution of the optical tool used in the photolithography, and the integration level of devices is improved. Further, the conductive type of each source/drain region is different from that of the doped region 104 at the top of each fin structure 100a. Therefore, the conductive type of the channel region between the source/drains is different from that of the doped region 104 at the top of each fin structure. Thus, the current leakage at the top corners of memory cells can be completely suppressed.

The structure of the memory cell disclosed by the present invention is described below. FIG. 1G-1 is a schematic 3-D view of FIG. 1G illustrating a memory cell according to one embodiment of the present invention. As shown in FIG. 1G-1 together with FIG. 1G, a memory cell is disposed on a substrate 100. The substrate 100 can be a bulk-Si substrate or a silicon-on-insulator (SOI) substrate. There is a plurality of isolation structures 120 disposed on the substrate 100 and these isolation structures 120 define at least one fin structure 100a in the substrate 100. The surface of the fin structure 100a is higher than that of the isolation structure 120.

The memory cell includes a gate 150, a charge trapping structure 130 and two source/drain regions 160. The gate 150 is disposed on the substrate 100, straddling the fin structure 100a. The material used for fabricating the gate 150 is, for example, doped polysilicon, metal or metal silicide.

The charge trapping structure 130 is disposed between the gate 150 and the fin structure 100a. The charge trapping structure 130 includes a tunneling dielectric layer 133, a charge trapping layer 135 and a blocking dielectric layer 137 that are formed adjacent to the fin structure 100a and are layered perpendicularly in the said sequence.

The material used for fabricating the tunneling dielectric layer 133 and the dielectric barrier layer 137 is, for example, silicon oxide or other similar dielectric materials. Furthermore, the thickness of the tunneling dielectric layer 133 is about 15~30 Å. Also, in one embodiment, the preferred thickness of the tunneling dielectric layer 133 is about 25 Å. Referring to FIG. 1F-1, this figure separately shows the part of the charge trapping structure 130 and the amplified graph of the tunneling dielectric layer 133. The tunneling dielectric layer 133 may be a bandgap engineered tunneling structure, for example, a structure stacked by silicon oxide/silicon nitride/silicon oxide (ONO) from bottom to top. In one embodiment, the thickness of the bottom silicon oxide layer 133a of the ONO structure is, for example, less than or equal to 20 Å, between 5~20 Å, or between 10~20 Å, it also can be less than or equal to 15 Å or between 10~15 Å; the thickness of the nitride layer 133b is less than or equal to 20 Å, for example, or between 10~20 Å, and the thickness of the top silicon oxide layer 133c is less than or equal to 35 Å, for example, between 25~35 Å. The material used for fabricating the charge trapping layer 135 is silicon nitride or other materials having high dielectric constants that are capable of trapping charges such as aluminum oxide, tantalum oxide, strontium titanate or hafnium oxide. In one embodiment, the thickness of the bottom silicon oxide layer 133a of the tunneling dielectric layer 133 is about 15 Å, the thickness of the silicon nitride layer 133b is about 20 Å, the top silicon oxide layer is about 35 Å, the charge trapping layer 135 is about 70 Å, the blocking layer is about 90 Å.

The two source/drain regions 160 are respectively disposed in the fin structure 100a exposed by the gate structure 155. The source/drain regions 160 may be P-doped regions that are doped with P-type dopants such as boron and boron difluoride ($BF_2$) or N-doped regions that are doped with N-type dopants such as phosphorous or arsenic. Furthermore, at the top of the fin structure 100a near the surface of the fin structure 100a, the memory cell further comprises a doped region 104 (shown in FIG. 1G) with the conductive type complementary to the conductive type of the source/drain regions 160 (shown in FIG. 1G-1). The thickness of the doped region 104 in the substrate 100 is up to about 100 angstrom. Also, the doping concentration of the doped region 104 is at least about $5 \times 10^{18}/cm^3$. Because of the doped region 104 with the conductive type complementary to that of the channel region between the source/drain regions 160 during the operation of the memory cell, the current leakage at the corners of the fin structure 100a, can be avoided. Moreover, the step height of the fin structure 100a is decreased and the size of the memory cell is decreased as well.

Figure 2A:
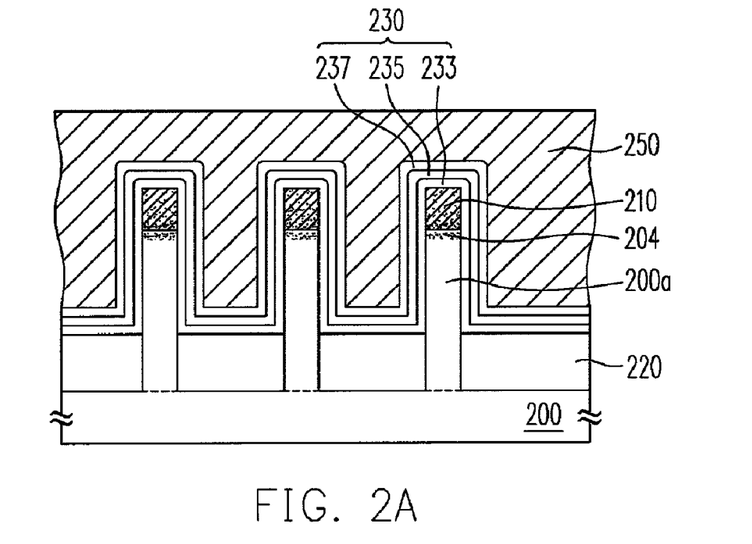
FIG. 2A is a schematic cross-sectional view of a memory cell according to one embodiment of the present invention.
Figure 2B:
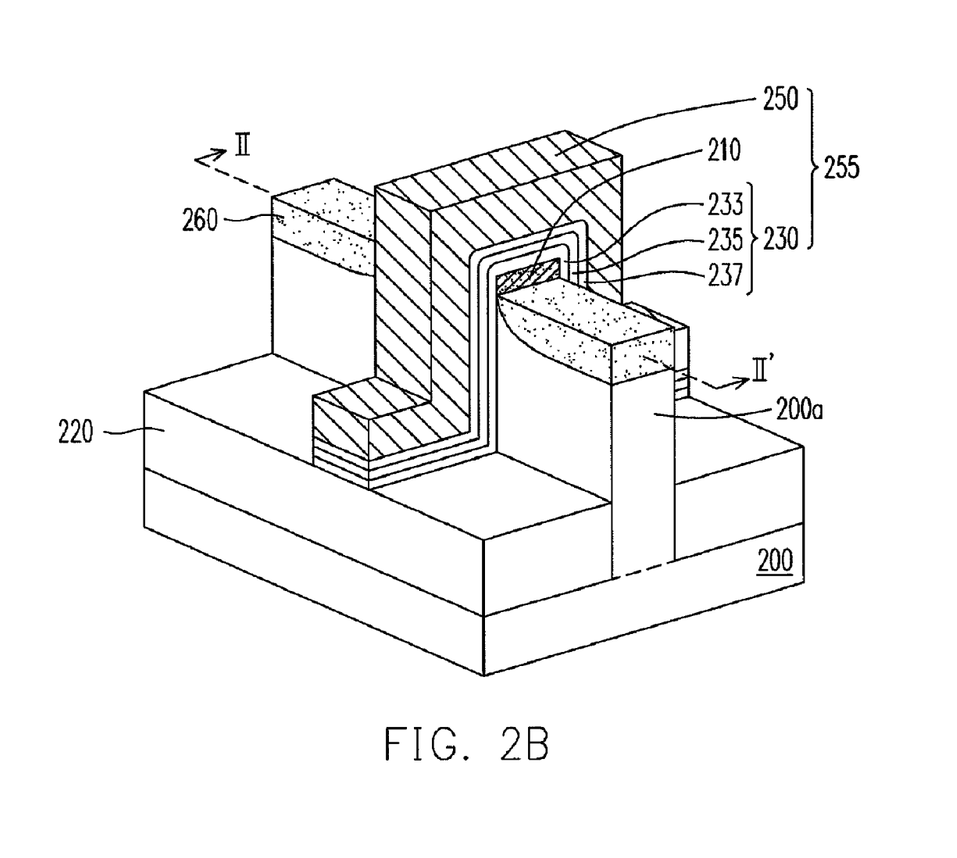
FIG. 2B is a schematic 3-D view of FIG. 2A showing a memory cell according to one embodiment of the present invention.

In the present embodiment, the surface treatment is directly implanting dopants into the surface of the substrate 100. However, the present invention is not limited by the way to implement the surface treatment. FIG. 2A is a schematic cross-sectional view of a memory cell according to one embodiment of the present invention. FIG. 2B is a schematic 3-D view of FIG. 2A showing a memory cell according to one embodiment of the present invention. The same elements in FIGS. 2A and 2B and FIGS. 1G and 1G-1 are designated with the similar reference numerals and the description thereof is omitted. In one embodiment, as shown in FIG. 2A and FIG. 2B, the surface treatment is implemented by forming a doped polysilicon layer 210 on the substrate 200 and then performing a thermal process to drive the dopants within the doped polysilicon layer 210 moving toward the interface between the substrate 200 and the doped polysilicon layer 210. Thus, a doped region 204, as same as the doped region 104 shown in FIG. 1A, is formed to be located near the surface of the substrate 200. It should be noticed that the conductive type of the doped polysilicon layer 210 is complementary to the conductive type of the later formed channel region of the memory cell in order to suppress the current leakage due to the corner edge effect during the operation of memory cells. That is, when the memory cell has an n-type channel region, the conductive type of the doped polysilicon 210 is a p-type, and vice versa. The method for foaming the doped polysilicon layer 210 includes, for example but not limited to, steps of forming a polysilicon layer (not shown) on the substrate 200 and then performing ion implantation process to implant dopants into the polysilicon layer. Alternatively, the method for forming the doped polysilicon layer 210 can be carried out by in-situ implanting dopants while the polysilicon layer is formed on the substrate 200. That is, as shown in FIG. 2A and FIG. 2B, in the memory cell, the doped polysilicon cap layer 210 formed from doped polysilicon layer 210 is disposed between the top of the fin structure 200a and the charge trapping structure 230 and the doped region 204 is located in the fin structure 200a near the top surface of the fin structure 200a. The thickness of the doped polysilicon cap layer 210 is up to about 200 angstrom. Also, the doping concentration of the doped polysilicon cap layer 210 is at least about $5 \times 10^{18}/cm^3$. The two source/drain regions 260 are respectively disposed in the fin structure 200a exposed by the gate structure 255. The source/drain regions 260 may be P-doped regions that are doped with P-type dopants such as boron and boron difluoride ($BF_2$) or N-doped regions that are doped with N-type dopants such as phosphorous or arsenic. It should be noticed that the conductive type of the doped polysilicon cap layer 210 is complementary to the conductive type of the source/drain regions 260. Because of the doped polysilicon cap layer with the conductive type complementary to that of the channel region between the source/drain regions 260 during the operation of the memory cell, the current leakage at the corners of the fin structure 200a, can be avoided. Moreover, the step height of the fin structure 200a is decreased and the size of the memory cell is decreased as well.

Figure 3A:
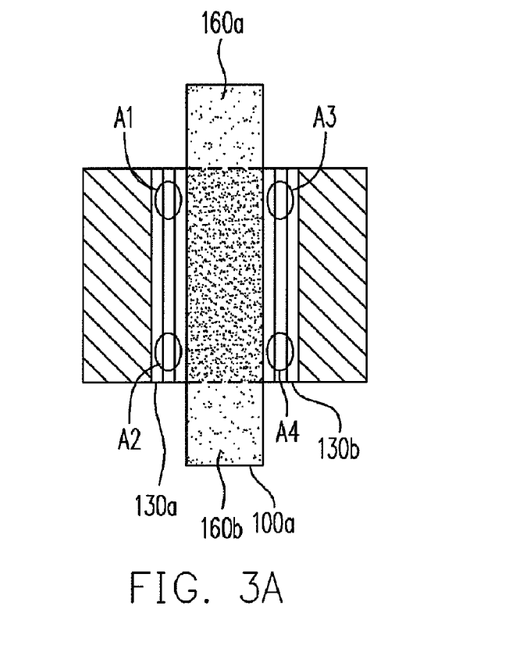
FIG. 3A is a top view of a cross-sectional view of the memory cell in FIG. 1G-1 along line I-I'.

The method for operating the memory cell shown in FIG. 1G-1 provided by the present invention is described below. FIG. 3A is a top view of a cross-sectional view of the memory cell in FIG. 1G-1 along line I-I'. The same elements in FIG. 1G-1 and FIG. 3A are designated with the same reference numerals and the description thereof is omitted.

Please refer to FIG. 3A together with FIG. 1G-1. The charge trapping structure 130 disposed on the fin structure 100a is represented by a first charge trapping structure 130a and a second charge trapping structure 130b. The source/drain regions 160 are respectively represented by a first doped region 160a and a second doped region 160b. Herein, the first charge trapping structure 130a includes a first storage region A1 that is adjacent to the first doped region 160a and a second storage region A2 that is adjacent to the second doped region 160b. The second charge trapping structure 130b includes a third storage region A3 that is adjacent to the first doped region 160*a* and a fourth storage region A4 that is adjacent to the second doped region 160*b*.

In one embodiment, when programming a memory cell, the sufficient amount of voltage applied to the gate 150 is, for example, approximately 16 volts and the first doped region 160*a* and the second doped region 160*b* are set to a floating or ground state, which generates sufficient voltage difference between the gate 150 and the fin structure 100*a* of the substrate 100 for making the charges store in the charge trapping structure 130 to program the memory cell. The scheme of the programming operation is the FN tunneling effect, for example.

When erasing the memory cell, the amount of voltage applied to the gate 150 is, for example, approximately −16 volts and the first doped region 160*a* and the second doped region 160*b* are set to a floating or ground state, which generates sufficient voltage difference between the gate 150 and the fin structure 100*a* of the substrate 100 for injecting charges into the substrate 100 from the charge trapping structures 130*a* and 130*b* to erase the charges stored in the charge trapping structures 130*a* and 130*b*. For example, the holes are injected into, or the electrons are removed from the charge trapping structures 130*a* and 130*b* to erase the memory cell. The scheme of the erasing operation may be the F-N tunneling effect.

In another embodiment, when programming the memory cell, a first voltage is applied to the gate 150, a second voltage is applied to the first doped region 160*a*, a third voltage is applied to the second doped region 160*b*, wherein the first voltage is greater than the third voltage and the third voltage is greater than the second voltage, injecting charges into the second storage region A2 and the fourth storage region A4 that are adjacent to the second doped region 160*b*. The first voltage is, for example, approximately 10 volts. The second voltage is, for example, approximately 0 volt. The third voltage is, for example, approximately 5 volts. The scheme of the programming operation is the channel hot electron injection (CHEI) effect, for example.

When performing an erasing operation, a fourth voltage is applied to the gate 150, a fifth voltage is applied to the first doped region 160*a*, a sixth voltage is applied to the second doped region 160*b*, wherein the sixth voltage is greater than the fifth voltage and the fifth voltage is greater than the fourth voltage, erasing the charges in the second storage region A2 and the fourth storage region A4. The fourth voltage is, for example, approximately −5 volts. The fifth voltage is, for example, approximately 0 volt. The sixth voltage is, for example, approximately 5 volts. The scheme of the erasing operation is the band to band hot hole tunneling effect, for example.

When performing a reading operation, a reverse read is, for example, operated by applying a reverse bias in a direction that is opposite to the direction of programming to read the charge storage state in the second storage region A2 and the fourth storage region A4. In one embodiment, a seventh voltage is applied to the gate 150, an eighth voltage is applied to the first doped region 160*a*, a ninth voltage is applied to the second doped region 160*b*, wherein the seventh voltage is greater than the eighth voltage and the eighth voltage is greater than the ninth voltage, to read the charges in the second storage region A2 and the fourth storage region A4. The seventh voltage is, for example, approximately 5 volts. The eighth voltage is, for example, approximately 1.6 volt. The ninth voltage is, for example, approximately 0 volts.

Certainly, when performing the programming operation, the first voltage can be applied to the gate 150, the second voltage that was originally applied to the first doped region 160*a* can be applied to the second doped region 160*b*, and the third voltage that was originally applied to the second doped region 160*b* can be applied to the first doped region 160*a*. Herein, the first voltage is greater than the third voltage and the third voltage is greater than the second voltage. Charges are injected into the first storage region A1 and the third storage region A3 that are adjacent to the first doped region 160*a*. The first voltage is, for example, approximately 10 volts. The second voltage is, for example, approximately 0 volt. The third voltage is, for example, approximately 5 volts. The scheme of the programming operation is the channel hot electron injection effect, for example.

When the charges in the first storage region A1 and the third storage region A3 are erased, the fourth voltage can be applied to the gate 150. The above-mentioned sixth voltage can be applied to the first doped region 160*a* and the above-mentioned fifth voltage can be applied to the second doped region 160*b*. Herein, the sixth voltage is greater than the fifth voltage and the fifth voltage is greater than the fourth voltage. The charges in the first storage region A1 and the third storage region A3 are erased. The fourth voltage is, for example, approximately −5 volts. The fifth voltage is, for example, approximately 0 volt. The sixth voltage is, for example, approximately 5 volts. The scheme of the erasing operation is the band to band hot hole tunneling effect, for example.

Similarly, the charge storage state of the first storage region A1 and the third storage region A3 can be read by a reverse read and by applying the seventh voltage to the gate 150, the above-mentioned ninth voltage to the first doped region 160*a*, and the above-mentioned eighth voltage to the doped region 160*b*. The seventh voltage is greater than the eighth voltage and the eighth voltage is greater than the ninth voltage, to read the charges in the first storage region A1 and the third storage region A3. The seventh voltage is, for example, approximately 5 volts. The eighth voltage is, for example, approximately 1.6 volt. The ninth voltage is, for example, approximately 0 volts.

In other words, the above-mentioned memory cell can be a memory cell that accesses a 1-bit data to program and erase through the F-N tunneling effect. On the other hand, the above-mentioned memory cell can be a memory cell that accesses a 2-bit data, programs through hot electron injection effect and erases through the band to band hot hole tunneling effect, varying according to the desired needs and design of the device. Further, since there is no charge trapping structure disposed on the protection layer, the charge trapping structures are respectively formed on both sides of the fin structure, which ensures no current leakage at the corners of the device during operation.

Figure 3B:
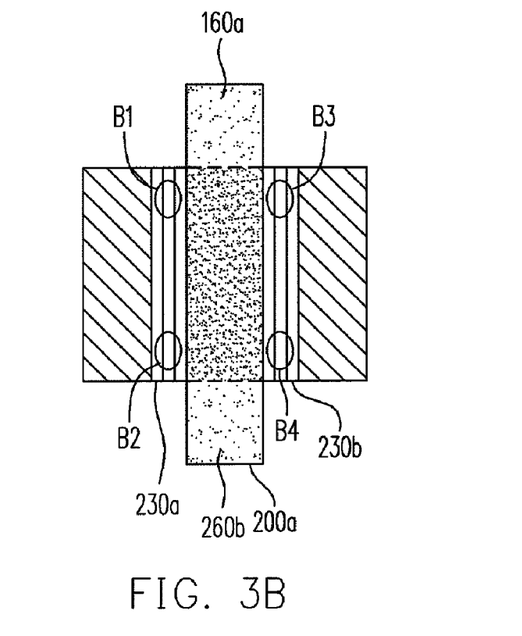
FIG. 3B is a top view of a cross-sectional view of the memory cell in FIG. 2B along line II-II'.

The method for operating the memory cell shown in FIG. 2B provided by the present invention is described below. FIG. 3B is a top view of a cross-sectional view of the memory cell in FIG. 2B along line II-IF. The same elements in FIG. 2B and FIG. 3B are designated with the same reference numerals and the description thereof is omitted. The difference between the memory cell in FIG. 1G and the memory cell in FIG. 2B is the way to suppress the current leakage at the corners of top of the fin structure. In the memory cell shown in 1G-1, the doped region 104 with the conductive type different from that of the channel between the source/drain regions 160 at the top of the fin structure can prevent the memory cell from current leakage at corners of the fin structure. In memory cell shown in FIG. 2B, the doped polysilicon cap layer 210 has dopants with conductive type different from the channel between the source/drain regions 260 and the dopants are located at the interface between the polysilicon cap layer 210 and the fin structure 200*a*, which can successfully overcome the current leakage problem occurring at the corners of the fin structure. Even though the arrangements of the memory cell in FIG. 1G-1 and the memory cell in FIG. 2B are slightly different, the concepts to solve the leakage problem happening at the corner of the fin structure are the same to each other. Thus, the operations of the memory cell shown in FIG. 2B are as same as the aforementioned operations of the memory cell shown in 1G-1 and are not described herein.

Accordingly, the present invention provides a memory cell that makes use of a trimming process to miniaturize the patterned mask layer. The present invention overcomes the limitations of photolithography and can precisely control the feature size of the subsequently thrilled fin structure and the later formed gate, which are beneficial to the integration level of the device and prevents the short channel effect. Further, the method provided by the present invention is a simple method that is easy to control and offers low manufacturing costs.

Moreover, by performing a surface treatment to form either a doped region in the fin structure or a doped polysilicon cap layer on the fin structure with the conductive type complementary to that of the channel between the source/drain regions, the current leakage at the top corners of the fin structure can be suppressed and the electrical performance of the memory cell during operation is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a memory cell comprising the steps of:
   providing a substrate;
   forming a doped region with a first conductive type in the substrate near a surface of the substrate, wherein a doping concentration of the doped region is higher than that of the substrate, and the method for forming the doped region comprises steps of:
   forming a doped polysilicon layer having a plurality of dopants with the first conductive type therein; and
   performing a thermal process to drive the dopants towards an interface between the substrate and the doped polysilicon layer so as to form the doped region in the substrate;
   removing a portion of the substrate to define a plurality of fin structures in the substrate;
   forming a plurality of isolation structures among the fin structures, wherein a surface of the isolation structures is lower than a surface of the fin structures;
   forming a gate structure over the substrate and straddling the fin structure, wherein the gate structure comprises a gate straddling the fin structure and a charge storage structure located between the fin structure and the gate; and
   forming a source/drain region with a second conductive type in the fin structure exposed by the gate structure, wherein the first conductive type is different from the second conductive type.

2. The method of claim 1, wherein the charge storage structure is directly in contact with the fin structure.

3. The method of claim 1, wherein the thickness of the doped region is up to about 100 Å.

4. The method of claim 1, wherein a doping concentration of the doped region is at least about $5 \times 10^{18}/cm^3$.

5. The method of claim 1, wherein the thickness of the doped polysilicon layer is up to about 200 Å.

6. The method of claim 1, wherein a doping concentration of the doped polysilicon layer is at least about $5 \times 10^{18}/cm^3$.

7. A method for manufacturing a memory cell comprising the steps of:
   providing a substrate;
   forming a doped cap layer with a first conductive type in the substrate near a surface of the substrate comprising:
   forming a doped polysilicon layer having a plurality of dopants with the first conductive type therein; and
   performing a thermal process to drive the dopants towards an interface between the substrate and the doped polysilicon layer so as to form the doped cap layer in the substrate;
   removing a portion of the substrate to define a plurality of fin structures in the substrate;
   forming a plurality of isolation structures among the fin structures, wherein a surface of the isolation structures is lower than a surface of the fin structures;
   forming a gate structure over the substrate and straddling the fin structure, wherein the gate structure comprises a gate straddling the fin structure and a charge storage structure located between the fin structure and the gate; and
   forming a source/drain region with a second conductive type in the fin structure exposed by the gate structure, wherein the first conductive type is different from the second conductive type.

8. The method of claim 7, wherein the charge storage structure is directly in contact with the fin structure and the doped cap layer.

9. The method of claim 7, wherein the thickness of the doped cap layer is up to about 100 Å.

10. The method of claim 7, wherein a doping concentration of the doped cap layer is at least about $5 \times 10^{18}/cm^3$.

* * * * *